(12) United States Patent
Dahlen et al.

(10) Patent No.: US 8,612,676 B2
(45) Date of Patent: Dec. 17, 2013

(54) TWO-LEVEL SYSTEM MAIN MEMORY

(75) Inventors: Eric J. Dahlen, Sherwood, OR (US);
Glenn J. Hinton, Portland, OR (US);
Raj K. Ramanujan, Federal Way, WA (US)

(73) Assignee: Intel Corporation, Santa Clara, CA (US)

( * ) Notice: Subject to any disclaimer, the term of this patent is extended or adjusted under 35 U.S.C. 154(b) by 287 days.

(21) Appl. No.: 12/976,545

(22) Filed: Dec. 22, 2010

(65) Prior Publication Data

US 2012/0166891 A1 Jun. 28, 2012

(51) Int. Cl.
*G06F 12/00* (2006.01)
(52) U.S. Cl.
USPC .......................................................... 711/113
(58) Field of Classification Search
None
See application file for complete search history.

(56) References Cited

U.S. PATENT DOCUMENTS

| | | | | |
|---|---|---|---|---|
| 5,809,526 A * | 9/1998 | Patel | ............................. | 711/122 |
| 5,860,083 A * | 1/1999 | Sukegawa | ..................... | 711/103 |
| 6,393,518 B2 * | 5/2002 | Koivuniemi | .................. | 711/113 |
| 6,523,102 B1 * | 2/2003 | Dye et al. | ....................... | 711/170 |
| 6,968,424 B1 * | 11/2005 | Danilak | ......................... | 711/113 |
| 7,146,455 B2 * | 12/2006 | Cheng | ............................ | 711/103 |
| 7,437,597 B1 * | 10/2008 | Kruckemyer et al. | ........ | 714/6.11 |
| 2006/0126833 A1 * | 6/2006 | O'Leary et al. | ................. | 380/30 |
| 2006/0138231 A1 * | 6/2006 | Elberbaum | .................... | 235/439 |
| 2007/0294543 A1 * | 12/2007 | Chiang | ........................ | 713/193 |
| 2011/0161748 A1 * | 6/2011 | Casper et al. | ................. | 714/708 |
| 2011/0231594 A1 * | 9/2011 | Sugimoto et al. | ............. | 711/103 |
| 2012/0047314 A1 * | 2/2012 | Chen et al. | .................... | 711/103 |
| 2012/0096332 A1 * | 4/2012 | Furno et al. | ................... | 714/773 |

* cited by examiner

*Primary Examiner* — Hiep Nguyen
(74) *Attorney, Agent, or Firm* — Blakely, Sokoloff, Taylor & Zafman LLP

(57) ABSTRACT

Embodiments of the invention describe a system main memory comprising two levels of memory that include cached subsets of system disk level storage. This main memory includes "near memory" comprising memory made of volatile memory, and "far memory" comprising volatile or nonvolatile memory storage that is larger and slower than the near memory.
The far memory is presented as "main memory" to the host OS while the near memory is a cache for the far memory that is transparent to the OS, thus appearing to the OS the same as prior art main memory solutions. The management of the two-level memory may be done by a combination of logic and modules executed via the host CPU. Near memory may be coupled to the host system CPU via high bandwidth, low latency means for efficient processing. Far memory may be coupled to the CPU via low bandwidth, high latency means.

20 Claims, 6 Drawing Sheets

TWO-LEVEL SYSTEM MAIN MEMORY

FIELD

Embodiments of the invention generally pertain to computing devices and more particularly to main memory configurations.

BACKGROUND

Computing systems and devices typically include adequate main memory, consisting of dynamic random access memory (DRAM), to store a subset of the contents of system nonvolatile disk storage. Main memory is used to reduce latency and increase bandwidth for the system processor to store and retrieve memory operands from disk storage.

DRAM packages such as dual in-line memory modules (DIMMs) are limited in terms of their memory density, and are also typically expensive with respect to nonvolatile memory storage. Currently, to increase the size of system main memory requires multiple DIMMs, which increases the cost and volume of the system. Increasing the volume of a system adversely affects the form factor of the system—e.g., large DIMM memory ranks are not ideal in the mobile client space. What is needed is an efficient main memory system wherein increasing capacity does not adversely affect the form factor of the host system.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

Embodiments of the invention are directed towards system main memory comprising two levels of memory (alternatively referred to herein as '2LM') that include cached subsets of system disk level storage (in addition to, for example, run-time data). This main memory includes a first level (alternatively referred to herein as "near memory") comprising smaller faster memory made of, for example, DRAM; and a second level (alternatively referred to herein as "far memory") which comprises larger and slower (with respect to the near memory) volatile memory (e.g., DRAM) or nonvolatile memory storage (e.g., flash memory).

The far memory is presented as "main memory" to the host operating system (OS), while the near memory is a cache for the far memory that is transparent to the OS, thus rendering the embodiments described below to appear the same as prior art main memory solutions. The management of the two-level memory may be done by a combination of logic and modules executed via the host central processing unit (CPU). Near memory may be coupled to the host system CPU via high bandwidth, low latency means for efficient processing. Far memory may be coupled to the CPU via low bandwidth, high latency means (as compared to that of the near memory).

Figure 1:
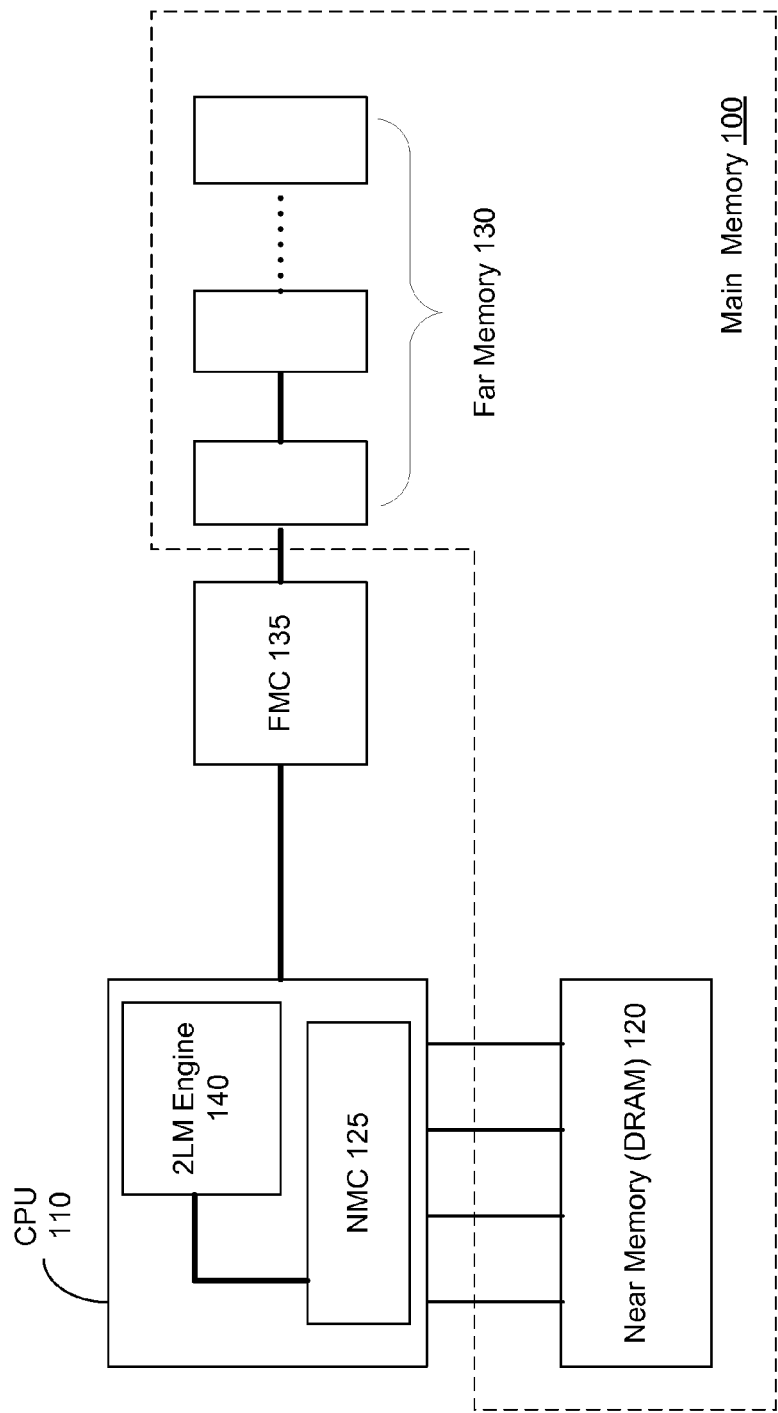
FIG. 1 is a block diagram of two-level system main memory according to an embodiment of the invention.

FIG. 1 is a block diagram of an embodiment of the invention. System main memory 100 provides run-time data storage and access to the contents of system disk storage memory (not shown) to CPU 110. Said CPU may include cache memory, which would store a subset of the contents of main memory 100.

In this embodiment, main memory 100 includes a level of volatile memory shown as near memory (DRAM) 120, and a level of memory, shown as far memory 130. Far memory may comprise either volatile or nonvolatile memory. In this embodiment, near memory 120 serves a low-latency and high-bandwidth (i.e., for CPU 110 access) cache of far memory 130, which may have considerably lower bandwidth and higher latency (i.e., for CPU 110 access).

In this embodiment, near memory 120 is managed by near memory controller (NMC) 125, while far memory 130 is managed by far memory controller (FMC) 135. FMC 135 reports far memory 130 to the system OS as main memory—i.e., the system OS recognizes the size of far memory 130 as the size of system main memory 100. The system OS and system applications are "unaware" of the existence of near memory 120 as it is a "transparent" cache of far memory 130.

CPU 110 further comprises 2LM engine module/logic 140. The "2LM engine" is a logical construct that may comprise hardware and/or micro-code extensions to support two-level main memory 100. For example, 2LM engine 140 may maintain a full tag table that tracks the status of all architecturally visible elements of far memory 130. For example, when CPU 110 attempts to access a specific data segment in main memory 100, 2LM engine 140 determines whether said data segment is included in near memory 120; if it is not, 2LM engine 140 fetches the data segment in far memory 130 and subsequently writes the data segment to near memory 120 (similar to a cache miss). It is to be understood that, because near memory 120 acts as a "cache" of far memory 130, 2LM engine 140 may further execute data prefetching or similar cache efficiency processes known in the art.

2LM engine 140 may manage other aspects of far memory 130. For example, in embodiments where far memory 130 comprises nonvolatile memory, it is understood that nonvolatile memory such as flash is subject to degradation of memory segments due to significant reads/writes. Thus, 2LM engine 140 may execute functions including wear-leveling, bad-block avoidance, and the like in a manner transparent to system software. For example, executing wear-leveling logic may include selecting segments from a free pool of clean unmapped segments in far memory 130 that have a relatively low erase cycle count.

It is to be understood that near memory 120 is smaller in size than far memory 130, although the exact ratio may vary based on, for example, intended system use. In this embodiment, it is to be understood that because far memory 130 comprises denser, cheaper nonvolatile memory, main memory 100 may be increased cheaply and efficiently and independent of the amount of DRAM (i.e., near memory 120) in the system.

Figure 2:
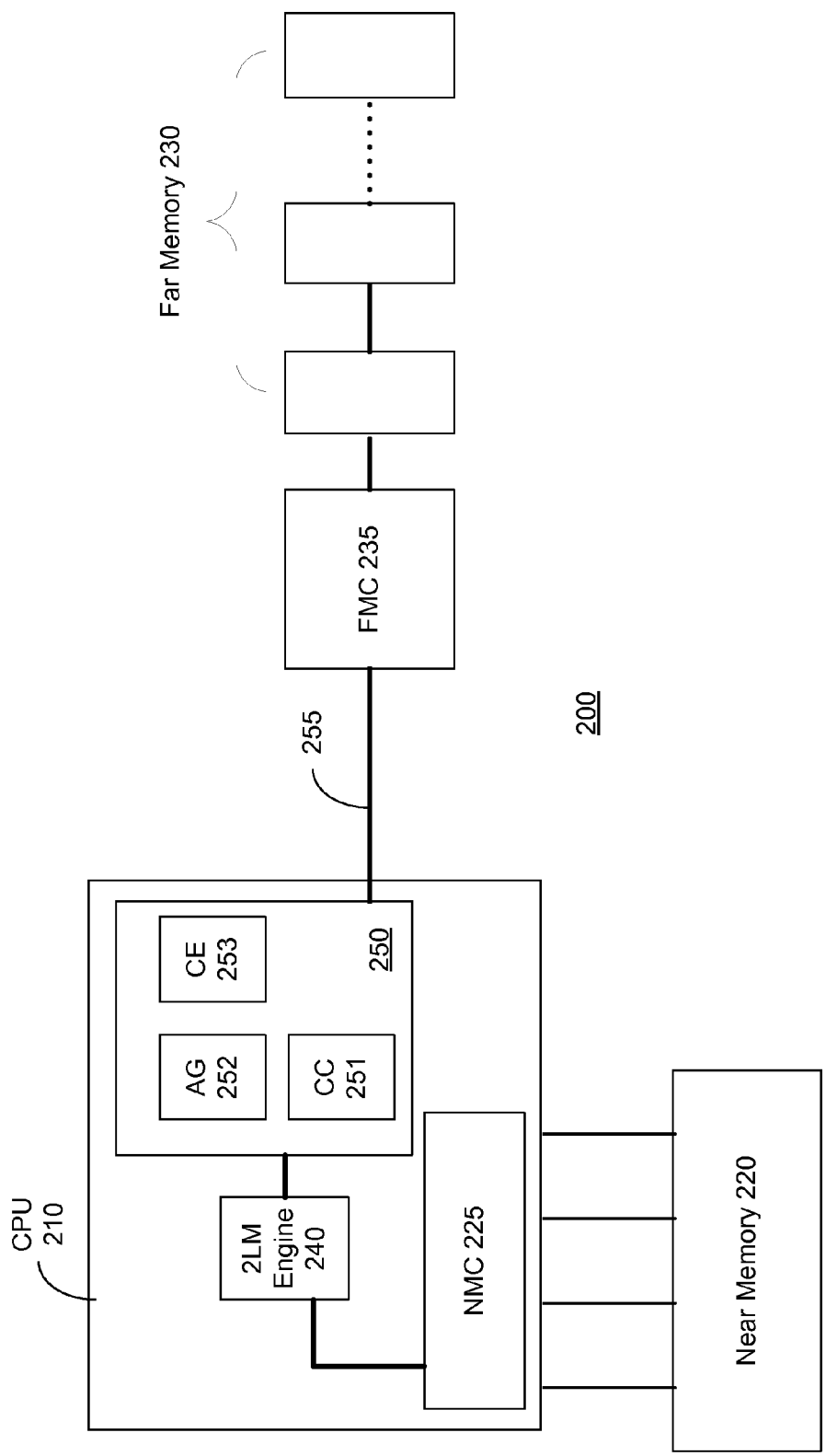
FIG. 2 is a block diagram of two-level system main memory according to an embodiment of the invention.

FIG. 2 is a block diagram of a system implementing an embodiment of the invention. In this embodiment, the 2LM architecture described in FIG. 1 is expanded to enable compression to the data transmitted to and from the "far memory" array. As similarly described above, in system 200, near memory DRAM 220 acts as a low-latency and high-bandwidth cache for far memory array 230, which transfers data to/from CPU 210 with considerably lower bandwidth and higher latency. Thus, it is understood that a primary performance parameter for system 200 is the bandwidth of the path by which data segments (e.g., pages or sectors) are transferred between near memory subsystem 220 and far memory subsystem 230.

It is understood that computer workloads vary in their "cache friendliness"—i.e., some workloads generate much higher cache miss-rates than others, and thus do not improve upon increasing cache size. Thus, it is to be understood that the performance of system 200 is dependent, in part, upon the bandwidth capacity between near memory 220 and far memory 230. The greater the capability to meet high miss-rate bandwidth demands, the fewer the number of real workloads that will saturate the near-far memory transfer path.

In this embodiment, the near-far memory transfer path is controlled, in part, by port control module 250. Said port control module includes sub-modules to accommodate the resulting changes in data size created by the compression and decompression steps in the transfer process described below. In this embodiment, port control module 250 includes hardware compression and decompression engine (CE) 253, compression control block (CC) 251 and address generation block (AG) 252. CE 253 may utilize any compression method known in the art and suitable for the intended use of system 200. Port control module 250 may further execute a scheme for messaging between CC 251 and FMC 235.

CE 253 processes data payload information moving between near memory 220 and far memory 230 across I/O interface 255. In one embodiment, to support system implementations with multiple FMC instances, a single instance of CE 253 is shared. In another embodiment, multiple CEs are implemented per I/O interface.

In one embodiment, far memory 230 stores data in compressed form and near memory 220 includes the corresponding uncompressed version. Thus, when near memory 220 request contents of far memory 230, FMC 235 retrieves said contents and returns it across I/O interface 255 in fixed payload sizes tailored to match the compression algorithm in use (e.g., a 256B transfer). CE 253 may then uncompress the data, and each accumulated cache line may be transferred in sequence to near memory 220 via NMC 225.

Initialization of AG 252 may be accomplished either by vendor-specific extensions to the header accompanying payloads from the FMC, or by a preamble vendor-defined message (VDM) issued by the FMC prior to the first payload transfer. In one embodiment, AG 252 is initialized to the first of the sequential near memory cache line addresses at the onset of a transfer, and generates sequential addresses until the transfer is complete. Thus, NMC 225 is "unaware" of any compression employed between port control module 250 and FMC 235.

It is understood that the amount of compression achieved on any given transfer is data-dependent, so embodiments of the invention may use padding (e.g., adding zeros) to complete the last full payload of compressed information from a fixed number of target cache lines in a data segment. For example, a 1 KB segment may contain 16 cache lines of 64B each on near memory 220, which may correspond to three 256B payloads of compressed data across I/O interface 255, given a compression ratio between 25 and 50 percent.

In the event FMC 235 requests data from near memory 220, FMC may issue a transfer request to CC 251, which may further initialize AG 252 to pull the target cache lines sequentially from the near memory. CE 253 may then pack the pulled cache lines into compressed fixed payloads (e.g., 256B, to be consistent with the example embodiment discussed above) that are then issued to FMC 235, in order, until the transfer is complete.

In one embodiment, CC 251 initializes AG 252 with a destination address in FMC 235 to receive the compressed payloads, and the AG must automatically generate subsequent FMC target addresses until the entire data segment has been transferred. For example, FMC 235 may issue a VDM to request the transfer from CC 251, and stipulate both the target data segment of near memory 220, and destination in far memory 230. In one embodiment, FMC 235 detects when compression is present and enabled, and requests data as described above (rather than to pull the target data segment directly from near memory 220 if compression is not present or enabled).

2LM engine 240 may utilize a "tag table" to determine which data segments are included in near memory 220, and which data segments must be fetched from far memory 230. Thus, when memory is compressed it must be determined which far memory address blocks correspond to which data segments in the address map utilized by said tag table. In one embodiment, this is accomplished by extending the semantics of the "transfer complete" messaging between FMC 235 and 2LM engine 240. On data transfers to far memory 230, FMC 235 completion is routed through CE 253, which reports how many blocks were actually updated, and CPU 210 may then return unused blocks to a free list structures for later use.

This messaging may also provide for enforcement of ordering between the completion and the final data transfer from CE 253 to near memory 220. On data transfers to near memory 220, the related commands issued to FMC 235 may indicate the actual number of far memory blocks necessary to reconstruct the target data segment. In one embodiment, this information is stored via metadata extensions.

It is to be understood that data compression may increase the effective bandwidth of I/O interface 255 depending on the specific compression algorithm selected, and the specific data generated and utilized by the workload of system 200. In one embodiment, data transferred to far memory 230 is encrypted. To support both encryption and compression on the near/far memory link, embodiments of the invention may implement encryption in either CE 253, or in FMC 235. It would be possible to encrypt the compressed data, but the encrypted data would not compress effectively.

As described above, DRAM memory devices may be utilized for part of system main memory (i.e., near memory 120 and 220 as illustrated in FIGS. 1 and 2 respectively). It is also understood that DRAM is subject to a non-zero incidence of "soft errors" resulting in corruption of data, such that data retrieved from an affected DRAM location does not match the expected data stored to that location. Many systems implement an error correction code (ECC) algorithm to mitigate the effects of the soft error rate (SER), as well as other well-known effects that may result in corruption of data stored to DRAM. The robustness of the ECC algorithm employed in these systems directly impacts the reliability of the system; however, any DRAM subsystem protected by an ECC algorithm still has a non-zero probability of experiencing a detectable, uncorrectable error (DUE); that is, an error which is detected by the ECC algorithm, but cannot be corrected by it (i.e., a multi-bit error preventing the data from being restored). Embodiments of two-level system main memory may be configured to reduce DUE incidence.

Figure 3:
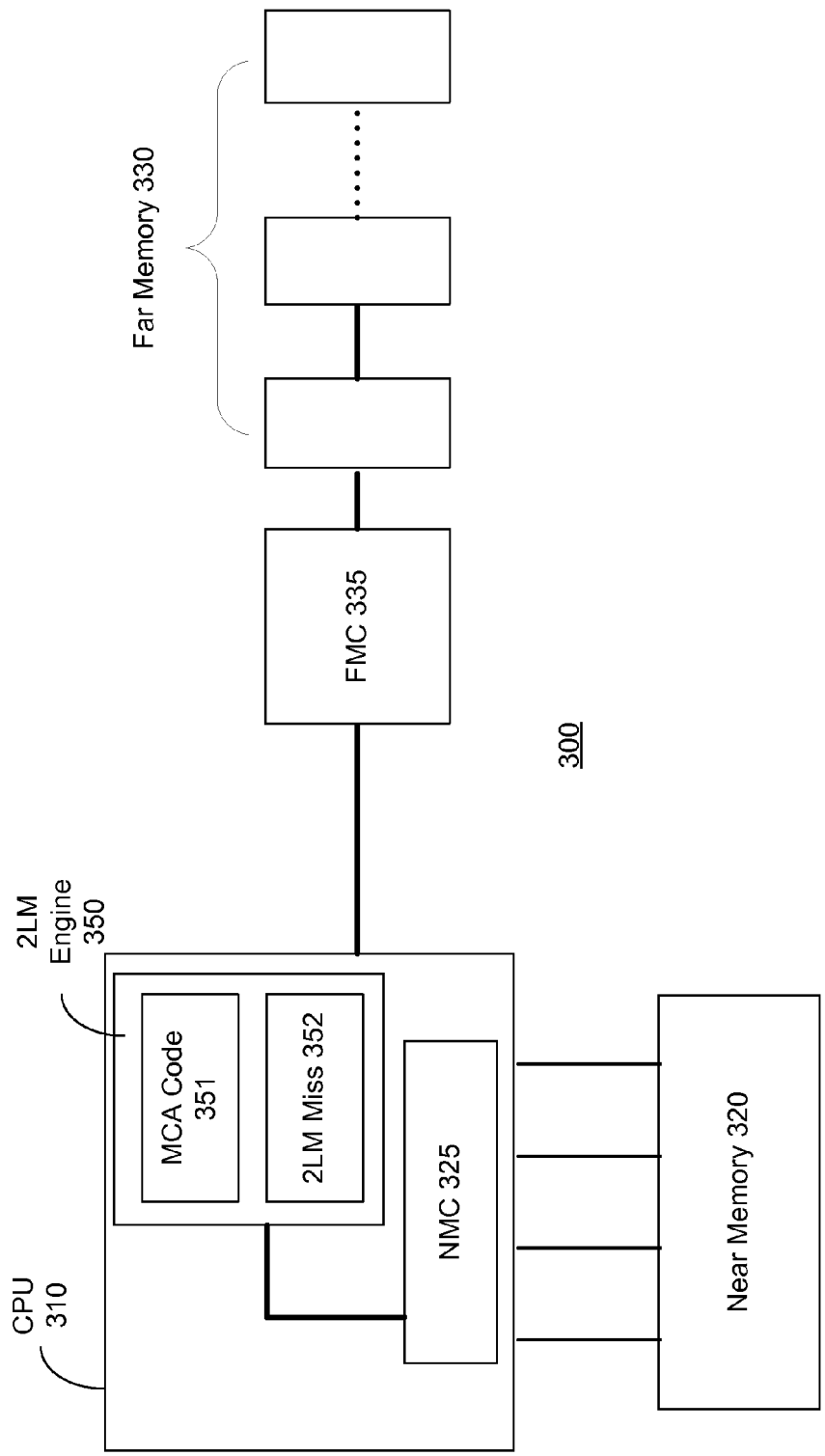
FIG. 3 is a block diagram of two-level system main memory according to an embodiment of the invention.

FIG. 3 is a block diagram of a 2LM system configured to reduce DUE incidence. In this embodiment, system 300 implements a layer of reliability above that provided by current ECC solutions. Similar to the systems described above, system 300 maintains a cached subset of "far memory" array 330 in "near memory" DRAM 320. In this embodiment, the contents of near memory 320 are protected by an ECC algorithm.

In this embodiment, a DUE in a data segment included in near memory 320 may be detected by NMC 325. The presence of the DUE is signaled to 2LM engine 350. The 2LM engine may execute Machine Check Architecture (MCA) code 351 to determine both the physical location (i.e., location in far memory 330) associated with the cached address (i.e., location in near memory 320), and determine whether the data segment has been modified in the near memory (i.e., if it is 'dirty'). In the case where the associated data segment is 'clean,' 2LM engine 350 may simply execute 2LM miss code 352 to re-fetch the (presumably uncorrupted) far memory copy of the data back into near memory 320 as if the DRAM access had in fact "missed" the near memory cache, and subsequently allow CPU 310 to access near memory 320 as if the DUE had never occurred.

In cases where the data segment in near memory 320 is in fact dirty, or in the case that associated data segment in far memory 330 is determined by FMC 335 to also be corrupt, the DUE is unrecoverable by hardware and is reported as an uncorrectable error. Thus, it is understood that while the above example embodiment will not completely eliminate the presence of DUEs, it will reduce them and thereby significantly increasing the reliability of system 300. It is understood that at any given time during operation, a fraction (normally much less than half) of the data segments in near memory 320 are "dirty" (i.e., have been modified since they were brought into the near memory cache). Thus, it is likely, that a DUE detected in near memory 320 affects an unmodified (i.e., clean) data segment; as such, system 300 according to the above embodiment may recover from such an error.

Embodiments of the invention may further utilize the above process to recover from DUE events in the primary cache structures of CPU 310 by similarly treating a clean hit in the CPU cache with a DUE as if it were in fact a miss. Embodiments of the invention may further recover from a DUE at the software level, although the software may need to incrementally re-start the operation which suffered the error after swapping the affected page back into two-level main memory from disk level memory (not shown).

In one embodiment, a tag table is used to track clean/dirty information at data segment levels (e.g., page or sector levels). Said tag table is hardware visible and may be hardware managed. MCA code 351 may utilize this table to selectively recover autonomously from uncorrectable error events reported at NMC 325 by re-fetching unmodified data from far memory 330. Thus, the example embodiment illustrated in FIG. 3 may utilize hardware-managed paging to recover from uncorrectable data errors.

Figure 4:
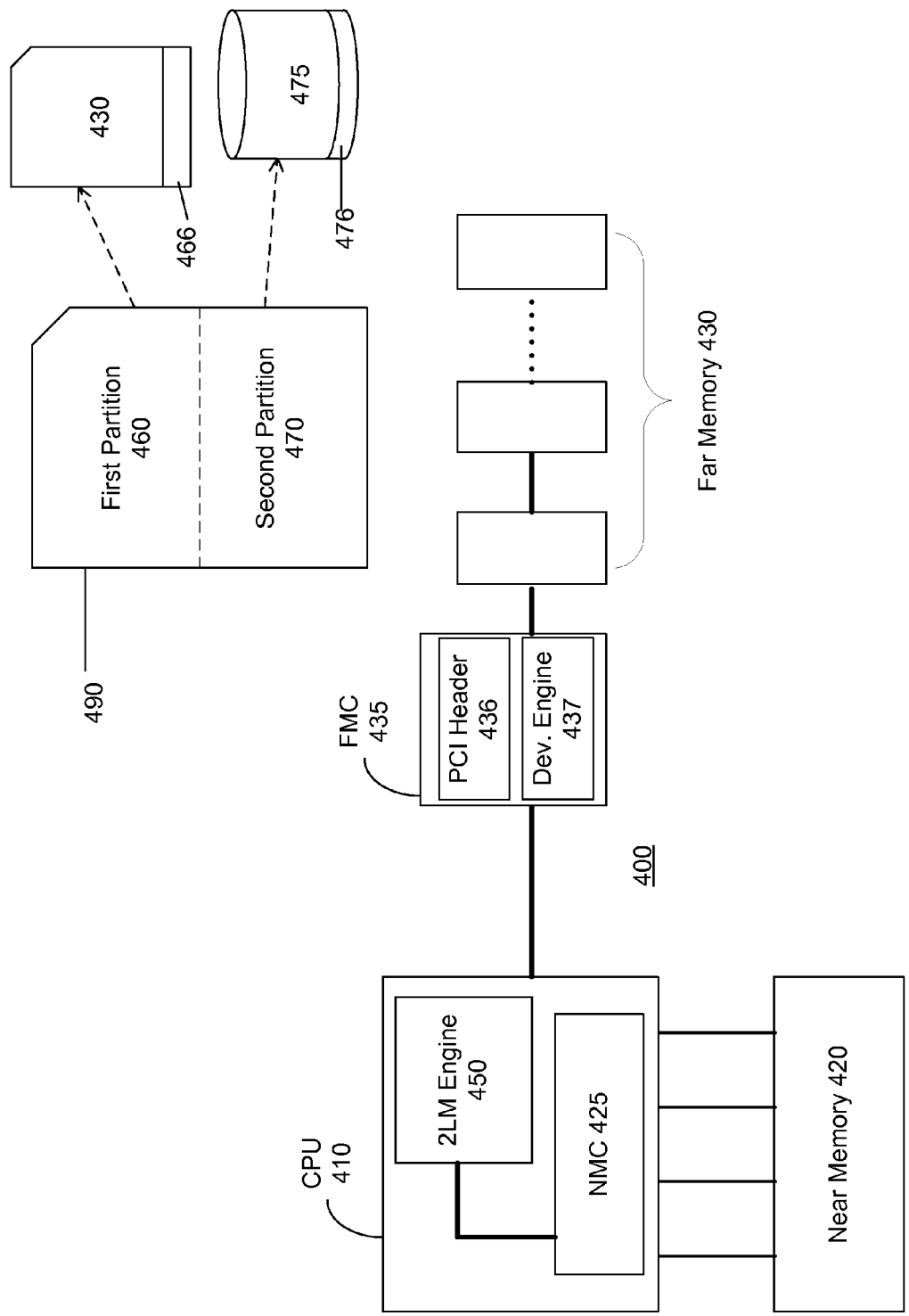
FIG. 4 is a block diagram of two-level system main memory including a main memory portion integrated with a disk storage device according to an embodiment of the invention.

FIG. 4 is a block diagram of a 2LM system including a main memory portion integrated with a disk storage device. In system 400, a device including a non-volatile second level of memory is also enabled to provide a logically integrated disk storage level. In this embodiment, system 400 includes main memory comprising near memory 420 and nonvolatile far memory 430 (managed by NMC 425 and FMC 435, respectively), and disk storage memory 475. System 400 includes modules/logic to enable partitioning of nonvolatile memory subsystem 490 (comprising at least one nonvolatile memory device and control logic), such that a portion of that capacity remains allocated to main memory usage (i.e., far memory 430 per the 2LM systems described above), and the remaining capacity is allocated to an integrated storage capability.

In this embodiment, FMC 435 includes modules/logic to partition memory subsystem 490 into two partitions: first partition 460 comprises far memory 430 (and may further include meta-data/spare sectors 466) and second partition 470 comprises disk level memory 475 (and meta-data/spare blocks 476). In this embodiment, the above described partitioning of far memory 430 (i.e., first partition 460) is configurable, such that the base 2LM functionality may be allocated only a fraction of the capacity present in system 400, and that portion may be operated completely independent of the remaining second partition 470 (i.e., disk level memory 475).

In this embodiment, FMC 435 includes PCI device header 436 to make disk level memory 475 visible to the basic input/output system (BIOS) of system 400, but transparent to 2LM engine 450. FMC 435 may further provide a register interface for software manipulation of the storage capability of disk storage memory 475. This may include the interrupt and power management interfaces defined by PCI standards, as well as device-specific interfaces for driver and management software manipulation, and for differentiated capabilities of nonvolatile memory subsystem partition 470 comprising disk storage memory 475.

FMC 435 may further provide logical data segment addressing (e.g., block addressing) for disk storage memory 475. In one embodiment of the invention, FMC 435 further presents a portion of the storage allocated space as standard memory-mapped I/O, rather than as logical storage data segments. Thus, software executed via CPU 410 may be optimized to make use of this fast non-volatile memory, and would have capabilities not directly available through a storage interface of device 490.

FMC 435 further includes memory device engine 437, which may execute functions including maintaining an independent tag table to track the contents and capacity of disk storage memory 475. Memory device engine 437 may further execute wear-leveling and bad-block management, as previously described, for disk storage memory 475. In an alternative embodiment, wear-leveling and bad-block handling is executed via driver software.

Thus, FMC 435 and PCI device header 436 may present a standard Serial Advanced Technology Attachment (SATA) or Serial Attached SCSI (SAS) software interface to disk memory 475 (i.e., partition 470 of device 490). The resulting capability constitutes a bootable logical disk volume directly analogous to a separate disk level device.

It is to be understood that the system 400 may further implement data compression, and data integrity generation and checking on data blocks moved to and from the partition including far memory 430 as described in FIGS. 2-3.

Thus, the example embodiment implemented in system 400 eliminates the need for additional discrete device modules and interfaces as it includes a large non-volatile high performance array of media built into the logical memory architecture of the system. It is to be understood that embodiments similar to the example described in FIG. 4 will outperform systems that include a discrete drive attached via traditional storage interfaces like SATA or SAS, or even high speed interfaces like PCI-Express, on all primary metrics including bandwidth, latency, TOPS, and power. System OS and APIs may be developed to take advantage of the capabilities of such systems.

Furthermore, it is to be understood that the example embodiment of FIG. 4 may provide a cost advantage relative to prior art systems, which must provide adequate DRAM capacity in addition to some separate minimal discrete disk storage capability. It is further understood that the above described memory partitioning allows for innovative form-factors, particularly in mobile client space and dense server space, because a minimum functional system according to these embodiments no longer requires any discrete disk support.

Figure 5:
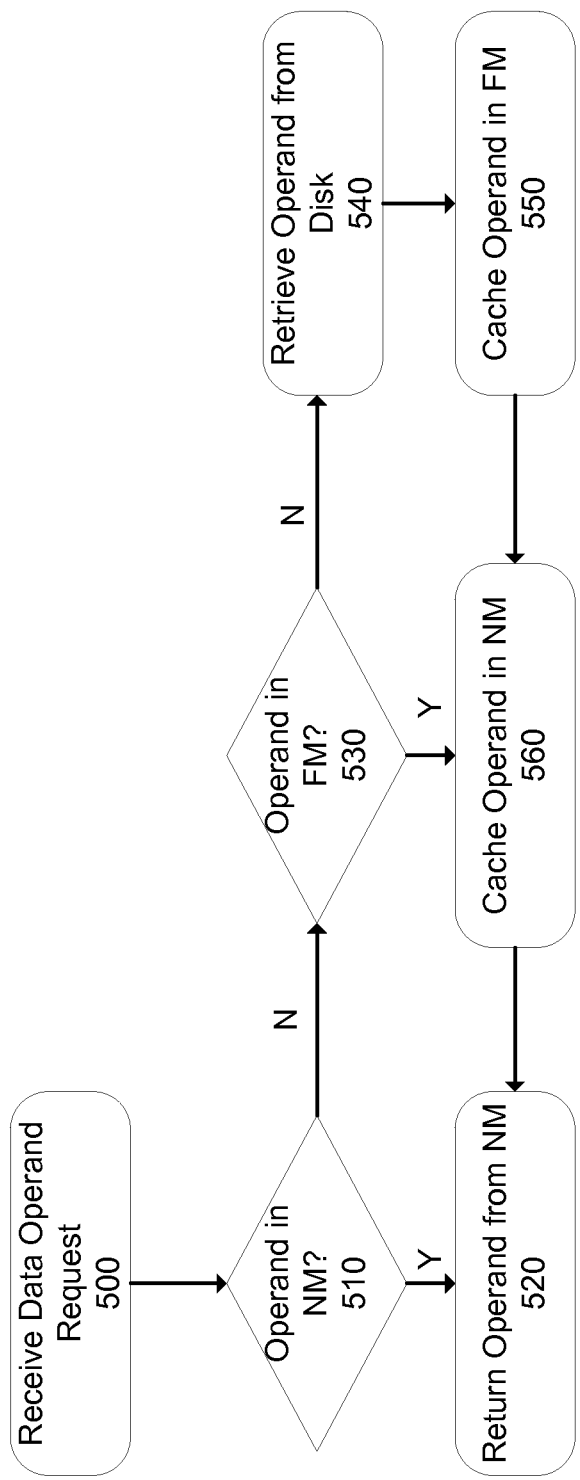
FIG. 5 is a flow diagram of an embodiment of the invention.

FIG. 5 is a flow diagram illustrating an embodiment of the invention. Flow diagrams as illustrated herein provide examples of sequences of various process actions. Although shown in a particular sequence or order, unless otherwise specified, the order of the actions can be modified. Thus, the illustrated implementations should be understood only as examples, and the illustrated processes can be performed in a different order, and some actions may be performed in parallel. Additionally, one or more actions can be omitted in various embodiments of the invention; thus, not all actions are required in every implementation. Other process flows are possible.

A request for a data operand is received, 500. It is then determined if the data operand in stored in main memory, and in this embodiment, main memory comprises a two-level memory comprising near and far memory as described above. If the data operand is in near memory, 510, the operand is returned to the requestor, 520. Otherwise, it is determined if the data operand is stored in far memory, 530. If the data operand is in far memory, it is cached into near memory, 560, and then returned to the requestor, 520. If the data operand is not in far memory, then it is retrieved from disk memory, 540, cached in far memory, 550, cached in near memory, 560, and then returned to the requestor, 520.

Figure 6:
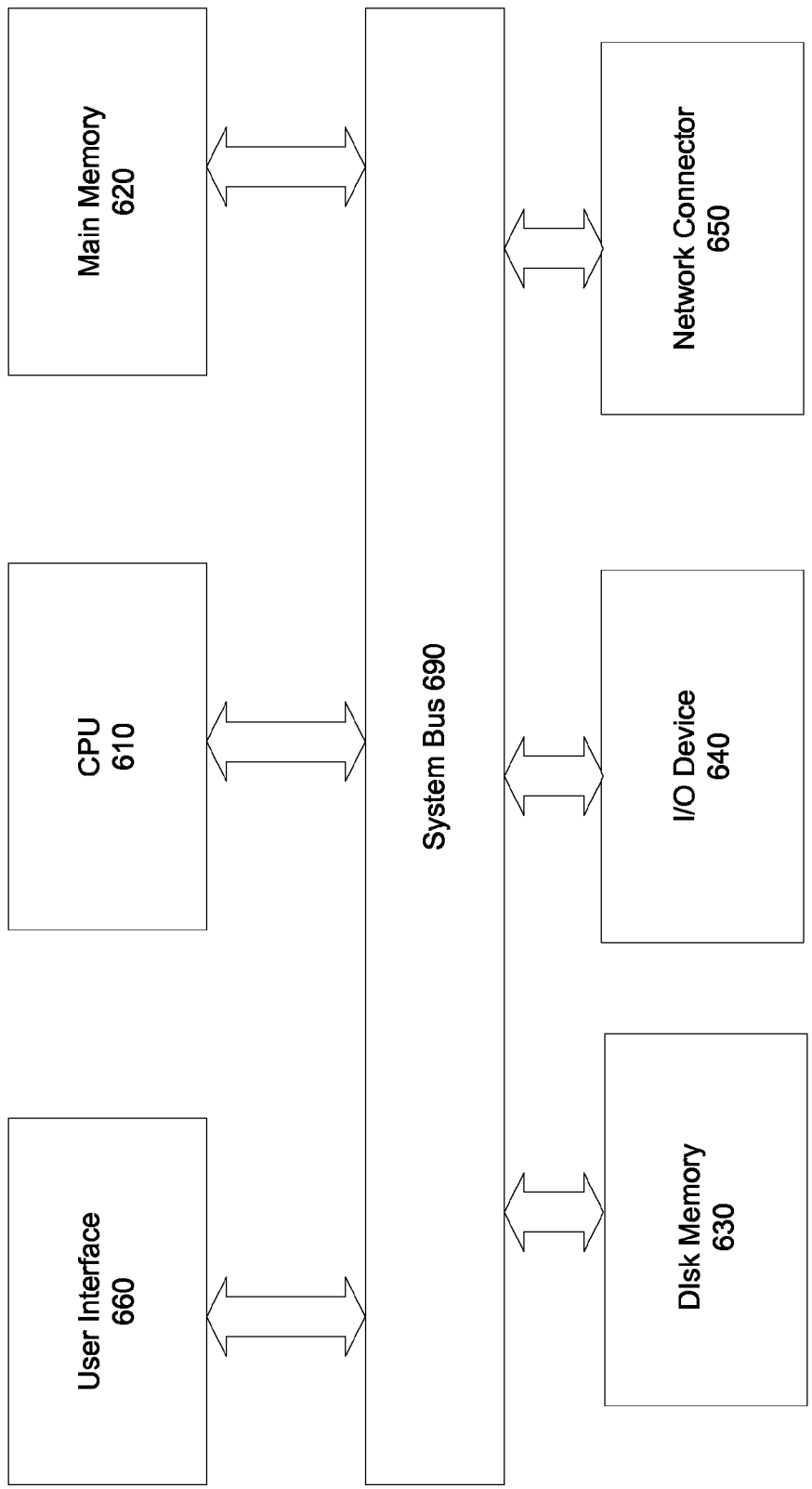
FIG. 6 is a block diagram of a system including an embodiment of the invention.

FIG. 6 is block diagram of a system that may utilize an embodiment of the invention. System 600 may be included in, for example, a desktop computer, a laptop computer, a netbook, a notebook computer, a personal digital assistant (PDA), a server, a workstation, a cellular telephone, a mobile computing device, an Internet appliance or any other type of computing device.

System 600 may include CPU 610 to exchange data, via system bus 690, with user interface 660, main memory 620, disk memory 630, I/O device 640 and network connector 650.

Main memory 620 comprises any 2LM embodiment described above, which include a near memory portion and a far memory portion. Said near memory portion may comprise, for example, Synchronous Dynamic Random Access Memory (SDRAM), Dynamic Random Access Memory (DRAM), RAMBUS Dynamic Random Access Memory (RDRAM), and/or any other type of random access memory device. Said far level memory may comprise, for example flash memory.

Disk memory 630 may be integrated with the far memory portion of main memory 620, or may be included in a separate device. Disk memory 630 may comprise, for example, a solid state disk (SSD) drive, flash memory, phase change memory (PCM), read-only memory (ROM), electrically erasable programmable read-only memory (EEPROM), or any other type of non-volatile memory device.

Network connector 650 may comprise, for example, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any other form of wireless communication protocol.

Various components referred to above as processes, servers, or tools described herein may be a means for performing the functions described. Each component described herein includes software or hardware, or a combination of these. Each and all components may be implemented as software modules, hardware modules, special-purpose hardware (e.g., application specific hardware, ASICs, DSPs, etc.), embedded controllers, hardwired circuitry, hardware logic, etc. Software content (e.g., data, instructions, configuration) may be provided via an article of manufacture including a non-transitory, tangible computer or machine readable storage medium, which provides content that represents instructions that can be executed. The content may result in a computer performing various functions/operations described herein.

A computer readable non-transitory storage medium includes any mechanism that provides (i.e., stores and/or transmits) information in a form accessible by a computer (e.g., computing device, electronic system, etc.), such as recordable/non-recordable media (e.g., read only memory (ROM), random access memory (RAM), magnetic disk storage media, optical storage media, flash memory devices, etc.). The content may be directly executable ("object" or "executable" form), source code, or difference code ("delta" or "patch" code). A computer readable storage medium may also include a storage or database from which content can be downloaded. A computer readable medium may also include a device or product having content stored thereon at a time of sale or delivery. Thus, delivering a device with stored content, or offering content for download over a communication medium may be understood as providing an article of manufacture with such content described herein.

The invention claimed is:

1. A system comprising:
   system main memory including a first memory level of volatile memory, and a second memory level of memory, the first memory level comprising one or more DRAM devices and to include a cached subset of the second memory level, the second memory level comprising flash nonvolatile memory;
   disk storage memory, the second memory level to include a cached subset of the disk storage memory;
   a processor to execute an operating system (OS) and an application to request contents of the disk storage memory via the system main memory, wherein the first memory level and the second memory level of the system main memory are separate from the processor, and a size of the system main memory presented to the OS is a size of the second memory level; and
   a memory controller to transfer data between the second memory level and the first memory level of the system main memory and the processor based on the application request(s).

2. The system of claim 1, wherein the second memory level and the disk storage memory are included in a memory subsystem comprising at least one flash nonvolatile memory device and control logic, the system further comprising
    a second memory level controller to partition the memory subsystem, into a memory partition comprising the second memory level and a disk storage memory partition, and to present the disk storage memory partition as a bootable logical disk volume to a basic input/output system (BIOS) of the system.

3. The system of claim 2, wherein the flash nonvolatile memory device(s) of the memory subsystem comprises solid state disk (SSD) flash memory.

4. The system of claim 1, the memory controller included in the processor.

5. The system of claim 1, further comprising logic to compress data transferred from the first memory level to the second memory level.

6. The system of claim 5, the second memory level to store data transferred from the first memory level in compressed form.

7. The system of claim 5, the logic to further encrypt data transferred between the first memory level and the second memory level.

8. The system of claim 1, the memory controller, in response to detecting an uncorrectable error in a data segment included in the first memory level, to further:
    determine if the data segment is unmodified with respect to the corresponding data segment included in the second memory level;
    copy the corresponding data segment included in the second memory level to the first memory level in response to determining the data segment is unmodified; and
    report a system error if the data segment is modified.

9. The system of claim 8, the memory controller, in response to detecting an uncorrectable error in the corresponding data segment included in the second memory level, to report a system error.

10. A device comprising:
    main memory to function as system main memory and including a first memory level of volatile memory, and a second memory level, the first memory level comprising one or more DRAM devices and to include a cached subset of the second memory level, the second memory level comprising flash non-volatile memory, wherein the main memory is to be communicatively coupled to a processor separate from the main memory, and wherein a size of the system memory presented to an operating system (OS) executed by the processor is a size of the second memory level; and
    a main memory controller to
        determine if a requested data operand is stored in the first memory level, and
        retrieve the data operand from the second memory level in response to a determination that the requested data operand is not stored in the first memory level.

11. The device of claim 10, wherein the second memory level is included in a memory subsystem further including a disk storage memory, the memory subsystem comprising
    at least one flash non-volatile memory device;
    a memory partition including the second memory level, and
    a disk storage memory partition including the disk storage memory and comprising a bootable logical disk volume.

12. The device of claim 11, wherein the flash non-volatile memory device(s) of the memory subsystem comprises SSD flash memory.

13. The device of claim 10, further comprising logic to compress data transferred from the first memory level to the second memory level.

14. The device of claim 13, the second memory level to store data transferred from the first memory level in compressed form.

15. The device of claim 13, the logic to further encrypt data transferred between the first memory level and the second memory level.

16. The device of claim 10, the memory controller, in response to detecting an uncorrectable error in the requested data operand included in the first memory level, to further:
    determine if the requested data operand is unmodified with respect to the corresponding data operand included in the second memory level;
    copy the corresponding data operand included in the second memory level to the first memory level in response to determining the requested data operand is unmodified; and
    report a system error if the requested data operand in the first memory level is modified.

17. The device of claim 16, the memory controller, in response to detecting an uncorrectable error in the corresponding data operand included in the second memory level, to report a system error.

18. A method comprising:
    executing an operating system (OS) and an application via a processor;
    receiving a request for a data operand in a system main memory, wherein the system main memory is separate from the processor and comprises a first memory level of volatile memory, and a second memory level of memory comprising nonvolatile memory, the first memory level comprising one or more DRAM devices and to include a cached subset of the second memory level, the second memory level comprising flash nonvolatile memory, and wherein a size of the system memory presented to the OS is a size of the second memory level;
    determining if the data operand requested by the application is stored in a first memory level of the system main memory;
    in response to determining the requested data operand is not stored in the first memory level, retrieving the data operand from the second memory level of the system main memory, and storing the data operand in the first memory level; and
    returning the requested data operand from the first memory level.

19. The method of claim 18, the second memory level to store data transferred from the first memory level is in at least one compressed form and encrypted form.

20. The method of claim 18, further comprising:
    detecting an uncorrectable error in the requested data operand included in the first memory level;
    determining if the data operand is unmodified with respect to the corresponding copy of the data operand included in the second memory level;
    copying the corresponding data operand included in the second memory level to the first memory level in response to determining the data operand is unmodified; and
    reporting a system error if the requested data operand included in the first memory level is modified.

* * * * *